(12) United States Patent
Iwasa

(10) Patent No.: US 8,062,947 B2
(45) Date of Patent: Nov. 22, 2011

(54) SEMICONDUCTOR DEVICE AND METHOD OF MANUFACTURING THE SAME

(75) Inventor: Seiichi Iwasa, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

(21) Appl. No.: 12/338,345

(22) Filed: Dec. 18, 2008

(65) Prior Publication Data

US 2009/0166735 A1    Jul. 2, 2009

(30) Foreign Application Priority Data

Dec. 19, 2007 (JP) ................. 2007-327730

(51) Int. Cl.
*H01L 29/72* (2006.01)

(52) U.S. Cl. ........ 438/300; 438/197; 438/257; 438/498; 438/694; 438/700; 438/759

(58) Field of Classification Search ............ 438/197, 438/257, 300, 498, 694, 700, 759
See application file for complete search history.

(56) References Cited

U.S. PATENT DOCUMENTS

| 6,087,235 | A |  | 7/2000 | Yu |  |
|---|---|---|---|---|---|
| 2003/0232472 | A1 | * | 12/2003 | Wu | ............... 438/257 |
| 2006/0138389 | A1 |  | 6/2006 | Belinski-Wolfe et al. |  |
| 2006/0138398 | A1 |  | 6/2006 | Shimamune et al. |  |
| 2007/0090466 | A1 |  | 4/2007 | Park et al. |  |
| 2007/0200170 | A1 |  | 8/2007 | Yamasaki et al. |  |

FOREIGN PATENT DOCUMENTS

| JP | 2005-158898 | 6/2005 |
|---|---|---|
| JP | 2007-27348 | 2/2007 |

OTHER PUBLICATIONS

Kanda et al., "Highly Stable 65nm Node (CMOS5) 0.56µm² SRAM Cell Design for Very Low Operation Voltage," 2003 Symposium on VLSI Technology Digest of Technical Papers (2003), pp. 13-14.

Nil et al., "A 45nm High Performance Bulk Logic Platform Technology (CMOS6) Using Ultra High NA(1.07) Immersion Lithography With Hybrid Dual-Damascene Structure and Porous Low-κ Beol", IEDM Technical Digest, pp. 685-688, (2006).

* cited by examiner

*Primary Examiner* — Edward Wojciechowicz
(74) *Attorney, Agent, or Firm* — Finnegan, Henderson, Farabow, Garrett & Dunner, L.L.P.

(57) ABSTRACT

The present invention relates to a method of manufacturing a semiconductor device having a shared contact for connection between a source/drain region and a gate electrode. After formation of a gate electrode via a gate insulating film on a semiconductor substrate, a top surface of the substrate is covered with a cover film. After removal of the cover film from at least one of sidewall surface of the gate electrode and a part of the top surface of the substrate adjacent to the sidewall surface, a semiconductor layer is epitaxially grown on a top surface of an exposed substrate to electrically connect the substrate and the at least one sidewall surface of the gate electrode. Then, a source/drain region is formed in a top surface part of the substrate or the semiconductor layer using the gate electrode as a mask.

8 Claims, 8 Drawing Sheets

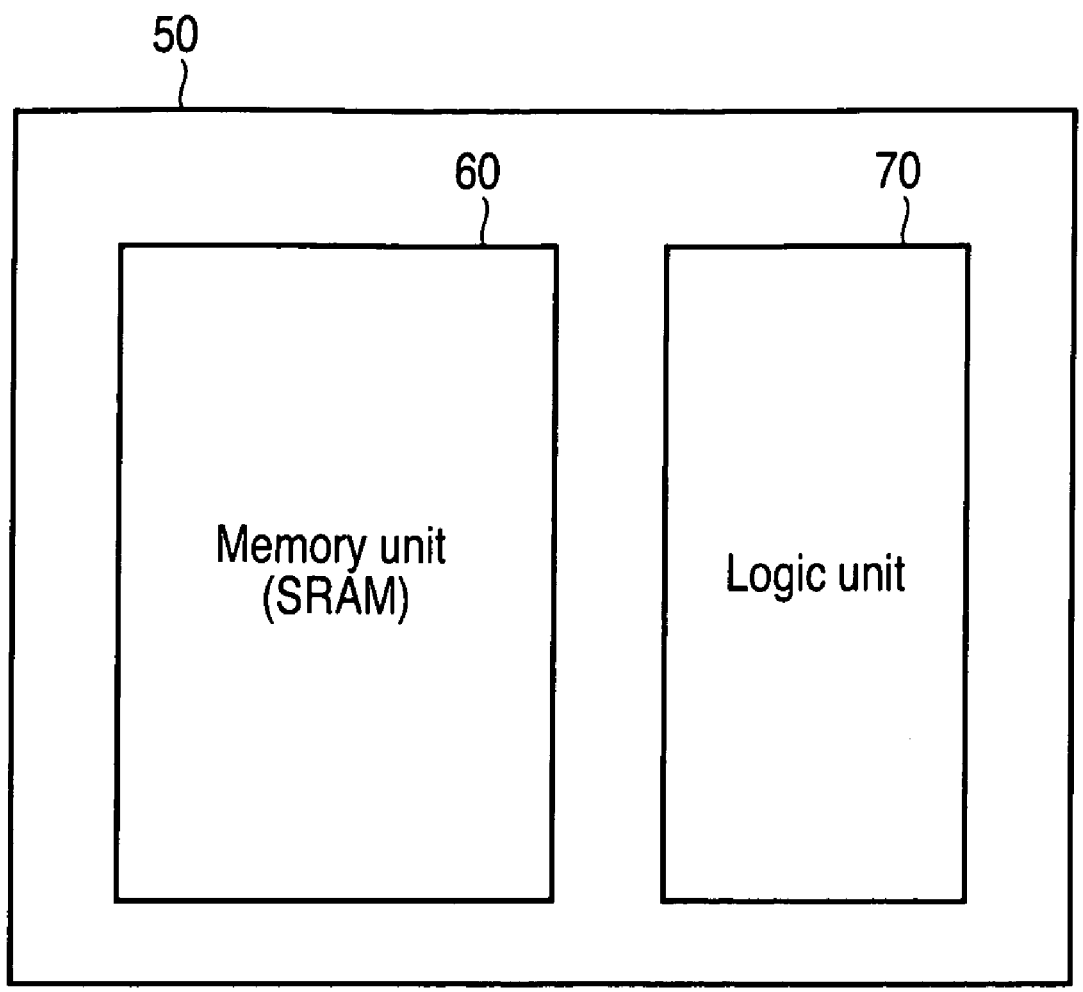
F I G. 1

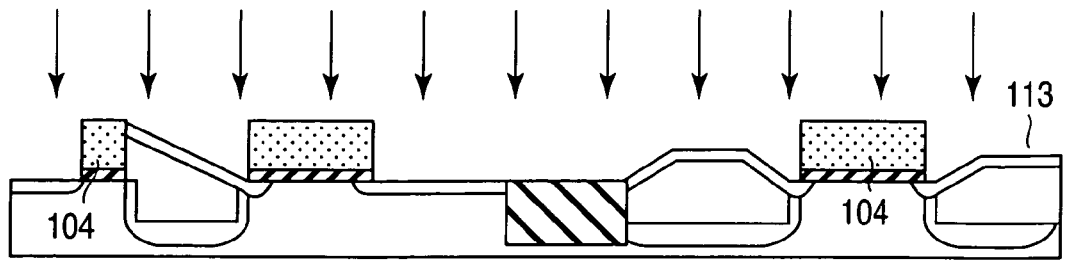
F I G. 4F
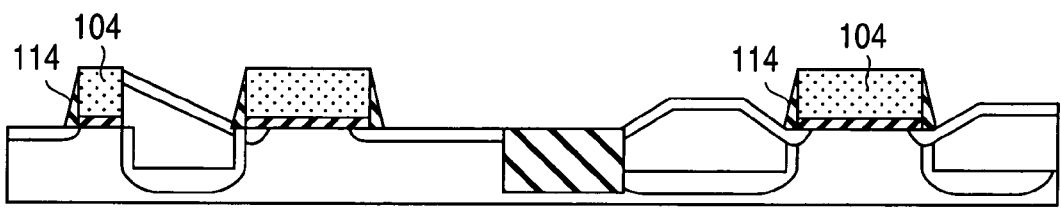
F I G. 4G
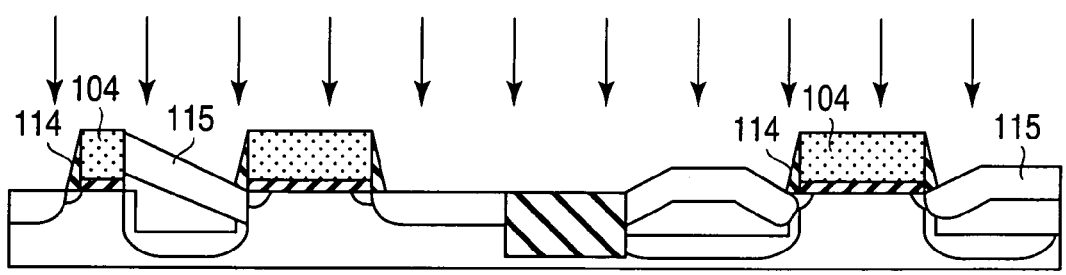
F I G. 4H
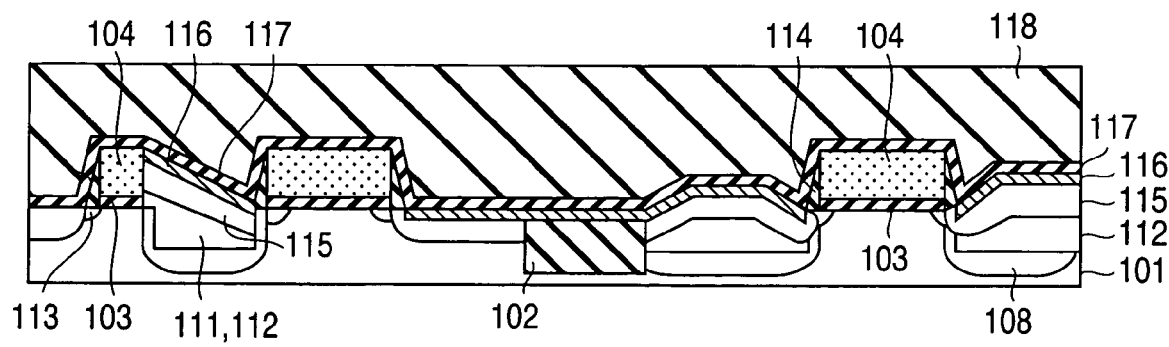
F I G. 4I

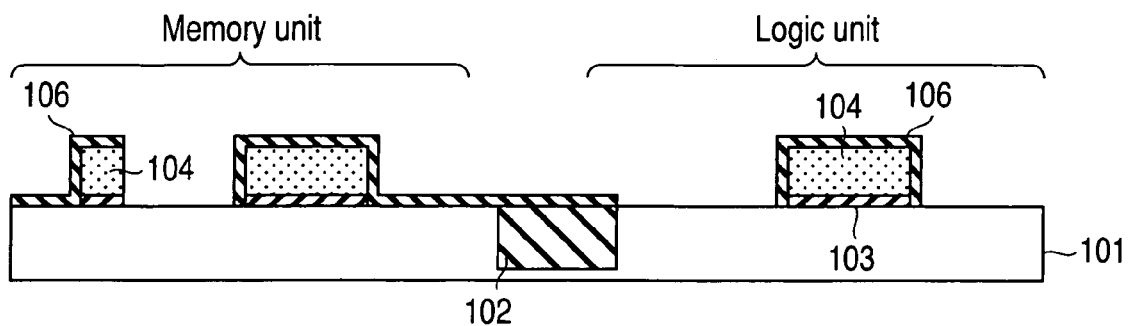
F I G. 5A
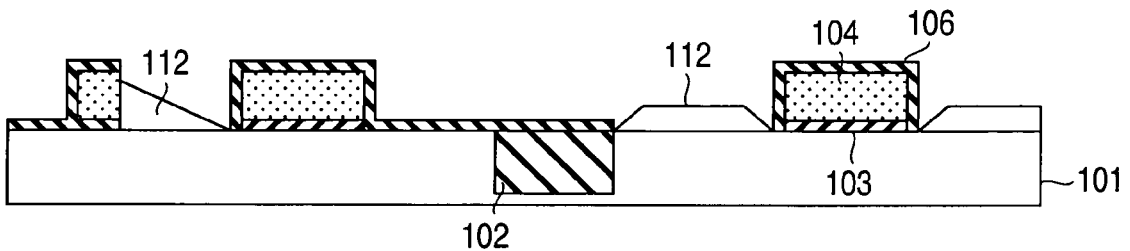
F I G. 5B
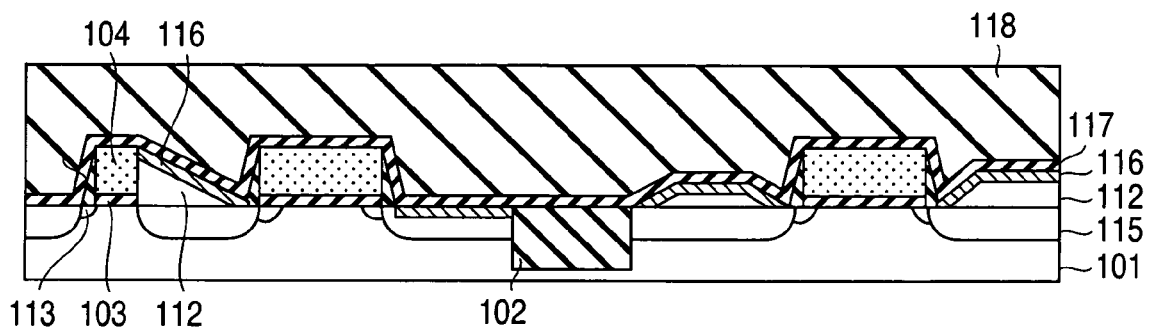
F I G. 5C

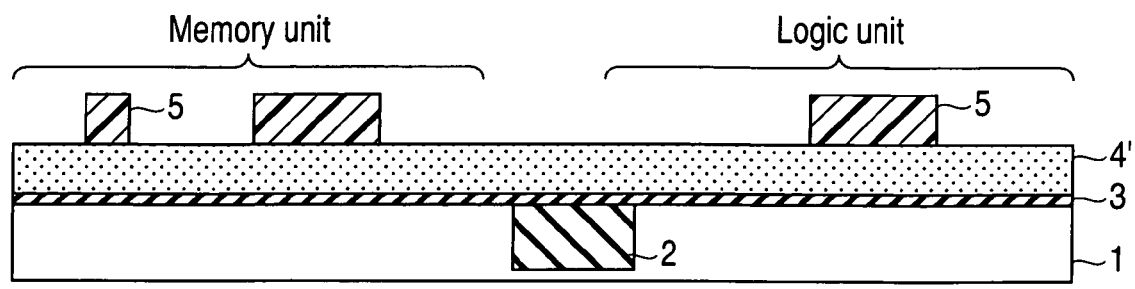
F I G. 6A
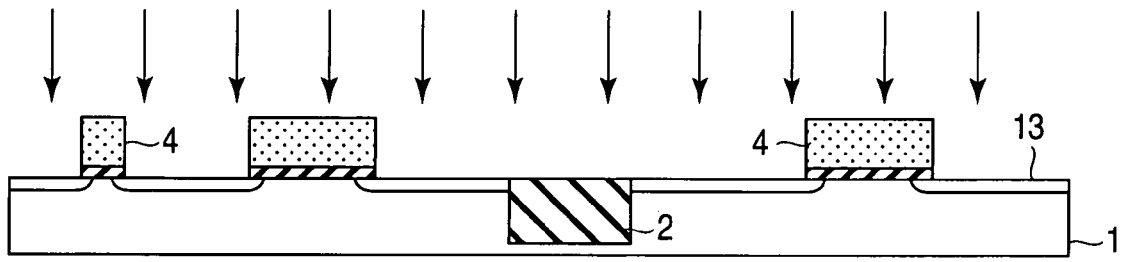
F I G. 6B
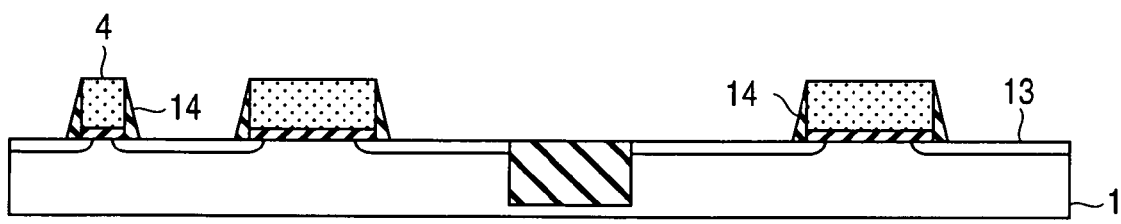
F I G. 6C
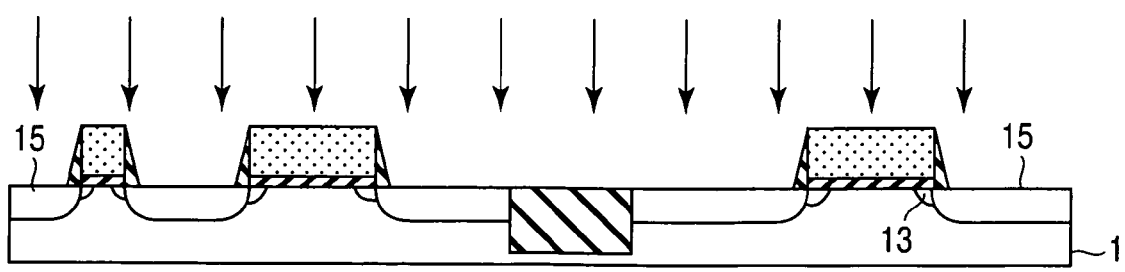
F I G. 6D

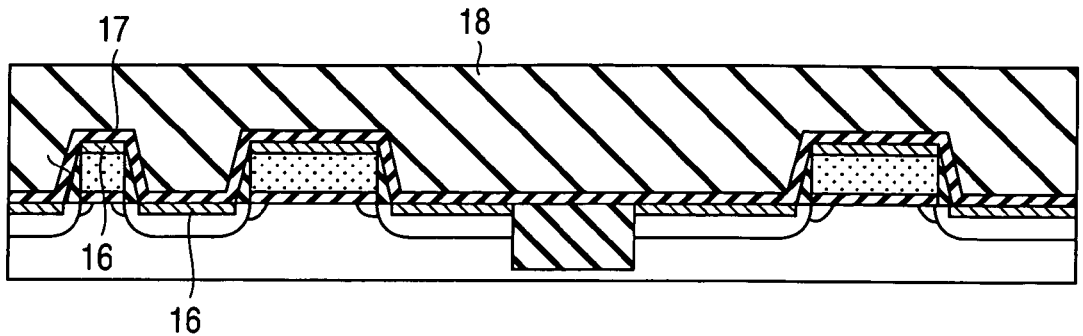
F I G. 6E
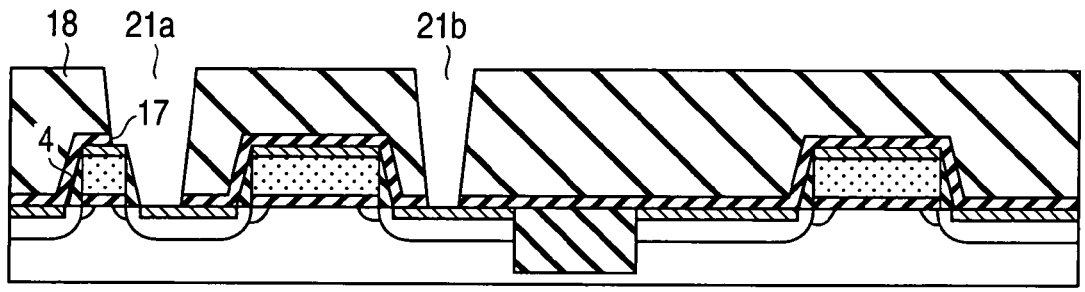
F I G. 6F
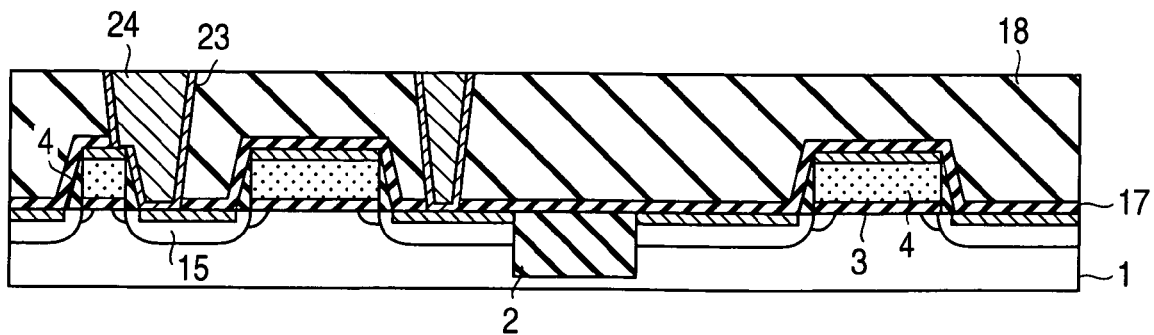
F I G. 6G

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2007-327730, filed Dec. 19, 2007, the entire contents of which are incorporated herein by reference.

BACKGROUND OF THE INVENTION

1. Field of the Invention

The present invention relates to a semiconductor device in which a metal insulator semiconductor (MIS) transistor is formed, and more particularly to a semiconductor device having a shared contact for connection between a source/drain region and a gate electrode.

2. Description of the Related Art

Recently, in the field of semiconductor devices such as a static RAM (SRAM) formed on a semiconductor substrate, a configuration provided with a shared contact for connection between a source/drain region and a gate electrode via a contact has been proposed (see Jpn. Pat. Appln. KOKAI Publication No. 2005-158898 or 2003 Symposium on VLSI Technology Digest of Technical Papers, pages 13 and 14).

This kind of shared contact has a hole greater in diameter than a normal contact hole because of the need to connect the source/drain region and the gate electrode. A shared contact having a hole greater in diameter has an etching rate higher than a normal contact hole. Therefore, when a shared contact and a normal contact are simultaneously processed, a shared contact having a hole greater in diameter often penetrates from a sidewall insulator film (sidewall spacer) of a gate electrode. When the shared contact penetrates from the sidewall spacer, the shared contact is brought into contact with an extension region of the source/drain region. Since the extension region is extremely thin, when the shared contact is made into contact with the extension region, junction leakage may occur.

In order to avoid this problem, a method of arranging a gate electrode on an element isolation insulating film and forming a contact in this part has been proposed (2006 IEDM Technical Digest Pages 685-688). This method, however, involves a problem that the contact resistance increases because of a small contact area of a shared contact. Further, securing a sufficient contact area prevents miniaturization of elements.

Another method has been proposed. According to the method, a sidewall insulating film of a gate electrode is removed and then a silicide layer extending from the top surface of the substrate to the side surface of the gate electrode is formed, thereby connecting the side surface of the gate electrode and a source/drain region via the silicide layer (see Jpn. Pat. Appln. KOKAI Publication No. 2007-27348). This method, however, requires additional steps for forming a shared contact, which results in complication of the process.

BRIEF SUMMARY OF THE INVENTION

A semiconductor device according to one embodiment of the present invention comprises a gate electrode formed via a gate insulating film on a semiconductor substrate, a semiconductor layer formed by epitaxial growth to connect at least one of the sidewall surfaces of the gate electrode and a top surface of the substrate adjacent to said at least one sidewall surface, and a source/drain region formed in one of the top surface of the substrate on either side of the gate electrode and the semiconductor layer.

A semiconductor device manufacturing device according to another embodiment of the present invention comprises forming a gate electrode via a gate insulating film in each of a memory unit and a logic unit on a semiconductor substrate, covering the gate electrodes and a top surface of the substrate with a cover film, removing the cover film formed on the top surface of the substrate from at least one side of the gate electrode of a first transistor of the memory unit which is to form a shared contact and from both sides of the gate electrode of a second transistor of the logic unit which is to cause distortion in a channel region, forming grooves in the substrate by etching a top surface part of the substrate using the cover film as a mask, removing the cover film formed on the gate electrode from at least one of sidewall surfaces of the gate electrode of the first transistor, filling each of the grooves provided in the substrate with a semiconductor layer by epitaxially growing the semiconductor layer in each of the grooves such that the epitaxial growth reaches said at least one sidewall surface of the gate electrode of the first transistor to electrically connect said at least one sidewall surface of the gate electrode of the first transistor and the substrate, and forming a source/drain region in one of the top surface part of the substrate and the semiconductor layer using the gate electrode as a mask.

A semiconductor device manufacturing device according to yet another embodiment of the present invention comprises forming a gate electrode via a gate insulating film in each of a memory unit and a logic unit on a semiconductor substrate, covering the gate electrodes and a top surface of the substrate with a cover film, removing the cover film formed on the top surface of the substrate from at least one of sidewall surfaces of the gate electrode of a first transistor of the memory unit which is to form a shared contact and from a part of the top surface of the substrate adjacent to said at least one sidewall surface, and removing the cover film formed on the top surface of the substrate on both sides of the gate electrode of a second transistor of the logic unit which is to form an elevated source/drain structure, forming an elevated source/drain structure on both sides of the gate electrode of the second transistor by epitaxially growing a semiconductor layer from the top surface of the substrate which has been exposed after removal of the cover film to electrically connect said at least one sidewall surface of the gate electrode of the first transistor and the substrate via the semiconductor layer, and forming a source/drain region in one of a top surface part of the substrate and the semiconductor layer using the gate electrode as a mask.

BRIEF DESCRIPTION OF THE SEVERAL VIEWS OF THE DRAWING

FIG. 1 is a plan view schematically showing a basic configuration of a semiconductor device according to a first embodiment of the present invention.

FIGS. 4A-4I are cross-sectional views showing a manufacturing process of the semiconductor device according to the first embodiment.

FIGS. 5A-5C are cross-sectional views showing a manufacturing process of a semiconductor device according to a second embodiment of the present invention.

FIGS. 6A-6G are cross sectional views showing a manufacturing process of a semiconductor device according to a reference example.

DETAILED DESCRIPTION OF THE INVENTION

Reference Example

Figure 2:
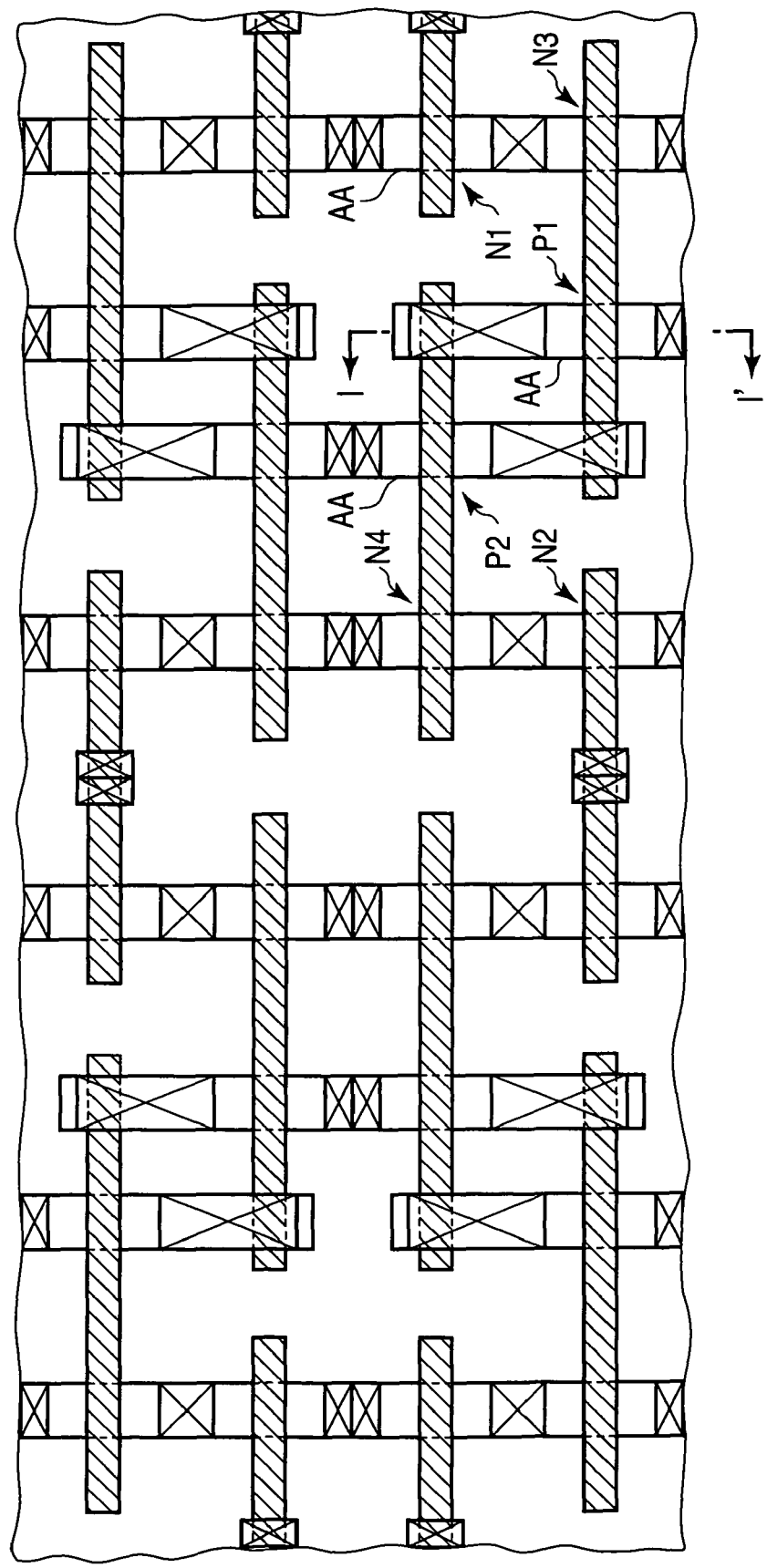
FIG. 2 is a plan view schematically showing an SRAM used in the semiconductor device according to the first embodiment of the present invention.

Before a description is given about the embodiments of the present invention, a reference example for forming a shared contact which makes a source/drain region and a gate electrode of a MOS transistor into contact will be described. In this description, a configuration in which a memory cell unit such as an SRAM and a logic part unit such as a peripheral circuit are formed on the same substrate is taken as an example.

As shown in FIG. 6A, after formation of an element isolation region 2 in a top surface part of a semiconductor substrate 1, an impurity material is introduced into the substrate 1 to form a well/channel. Then, a gate insulating film 3 and a gate electrode film 4' are formed. An electrode pattern 5 is formed on the gate electrode film 4' by means of lithography.

After formation of a gate electrode 4 by means of dry etching, an impurity material is introduced to form an extension region 13 of a source/drain region by means of ion implantation, as shown in FIG. 6B Then, as shown in FIG. 6C, a sidewall insulating film (sidewall spacer) 14 for keeping the source/drain region at a distance of approximately 30 nm is formed in the transistor from the view point of securing characteristics and reliability of a transistor.

As shown in FIG. 6D, an impurity material is then introduced and activated to form a source/drain region 15.

As shown in FIG. 6E, in order to reduce resistance of the gate electrode 4 and the top surface of the semiconductor substrate, metals such as Ti, Co and Ni are deposited to form an alloy layer (salicide) 16. Then, an SiN film 17, which becomes an etching stopper when a contact is formed, and an oxide film 18, which becomes an interlayer insulating film, are deposited and planarized by the CMP method.

As shown in FIG. 6F, after the oxide film 18 is processed by using the SiN film 17 as a stopper by means of lithography and dry etching, the SiN film 17 is processed until the SiN film 17 reaches the gate electrode 4 and the salicide on the top surface of the semiconductor substrate to form contact holes 21a, 21b. The reference number 21a denotes a contact hole for a shared contact, and the reference number 21b denotes a normal contact hole.

After the contact holes are bored, a barrier metal 23 such as TiN and a metal 24 are deposited on the entire surface of the substrate and unnecessary parts of the barrier metal 23 and the metal 24 are removed by the CMP method, thereby charging the barrier metal 23 and the metal 23 into the contact holes 21a, 21b, as shown in FIG. 6G. In this step, by boring the contact hole 21a to extend over the source/drain region and the gate electrode 4, a shared contact which connects the source/drain region 15 and the gate electrode 4 via the metal 24 is formed.

The description about subsequent steps will be omitted, but a configuration of a semiconductor device having a shared contact can be obtained by forming interlayer insulating films and metal interconnections and connecting the transistors to each other via a contact hole.

In the above-described configuration, however, the contact hole 21a often penetrates from the sidewall spacer 14 when the contact hole 21a for the shared contact is formed, as explained in "Description of the Related Art". This may cause occurrence of junction leakage since the shared contact is made into contact with the extension region 13.

Hereinafter, embodiments of the present invention will now be described with reference to the accompanying drawings.

First Embodiment

FIG. 1 is a plan view schematically showing a basic configuration of a semiconductor device according to a first embodiment of the present invention. An SRAM (memory unit) 60 and a peripheral circuit (logic unit) 70 are formed on a substrate 50.

Figure 3:
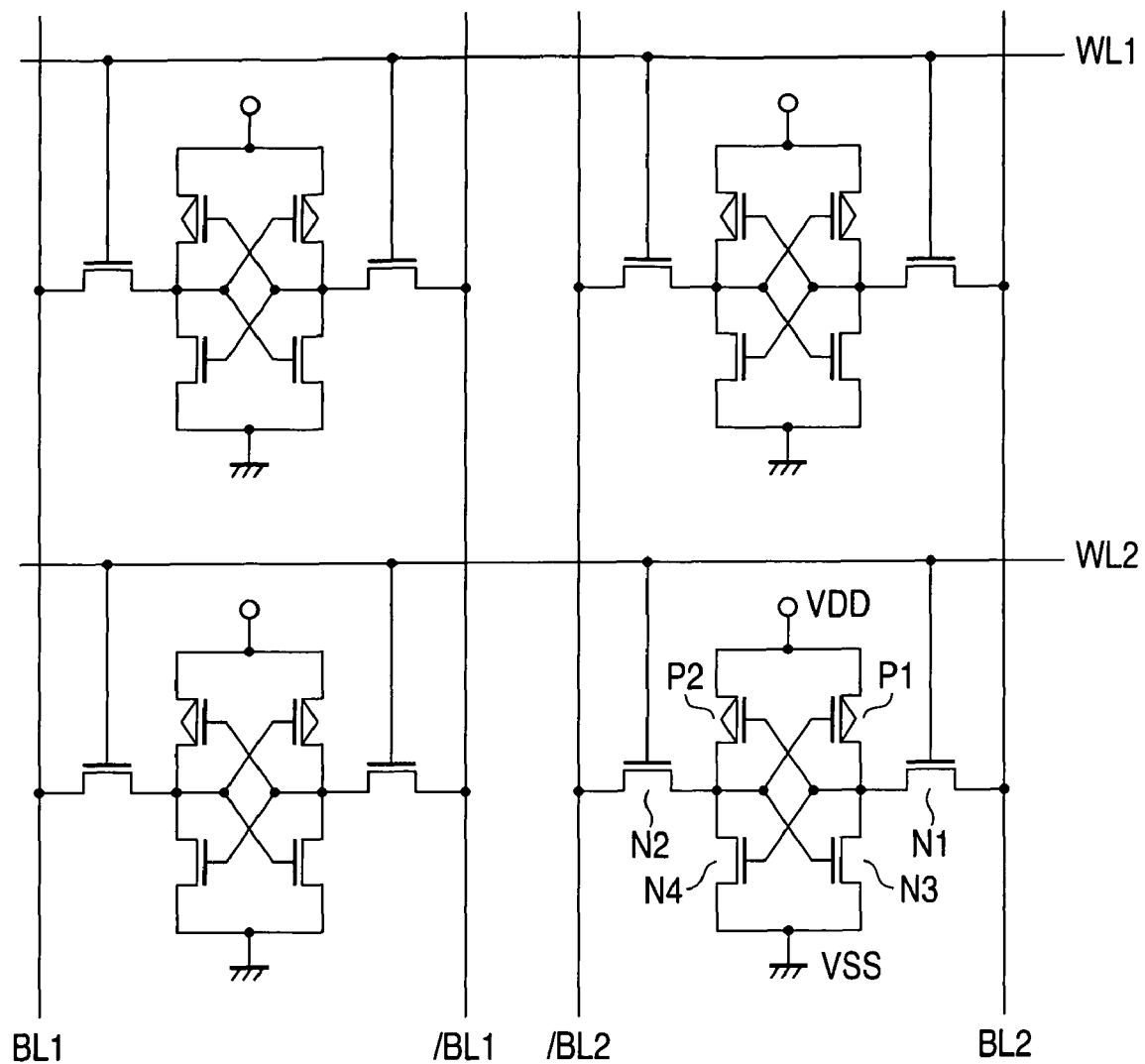
FIG. 3 is an equivalent circuit schematic showing a circuit configuration of the SRAM of FIG. 2.

FIG. 2 is a plan view schematically showing a configuration of an SRAM used in the present embodiment. In FIG. 2, a plan pattern of four normal bit cells arranged as 2 columns×2 rows is shown. In this basic layout pattern of the normal bit cells, p-channel MOSFETs (pMOSs) P1, P2 of the bit cell shown in the equivalent circuit schematic of FIG. 3 are arranged along a column direction. n-channel MOSFETs (nMOSs) N1, N3 and N2, N4 are arranged on either side of P1 and P2, respectively, along a row direction. In the basic layout pattern, a contact between a drain of N1 and a bit line BL and a contact between a drain of N2 and a complementary bit line/BL are arranged diagonal to each other. These contacts are shared by adjacent normal bit cells along the column direction. Similarly, a contact between a gate of Ni and a word line WL and a contact between a gate of N2 and the word line WL are arranged diagonal to each other. These contacts are shared by adjacent normal bit cells along the row direction.

Further, a so-called "cross-couple connection" is made. That is, a connect node of P1, N1 and N3 is connected to a gate pattern of P2, N4, and a connect node of P2, N2 and N4 is connected to a gate pattern of P1, N3.

Such normal bit cells are arranged by repeating the above-described basic layout pattern such that the bit line contacts are arranged lineally symmetrical along the column direction, and such that the word line contacts are arranged lineally symmetrical along the row direction. A memory cell array is thus configured. The reference mark "AA" in the FIG. 2 denotes an active region in which a source/drain region and a channel of a MOSFET are to be formed. In the periphery of the active region, an element isolation region is formed.

The present embodiment is characterized by how to configure a shared contact which connects a source/drain region and a gate electrode of a specific MOSFET. The configuration of the shared contact will be described below in detail with reference to FIGS. 4A-4I. In FIGS. 4A-4I, the left side corresponds to a cross section of the memory unit taken along line I-I' of FIG. 2, and the right side corresponds to a cross section of the logic unit.

Figure 4A:
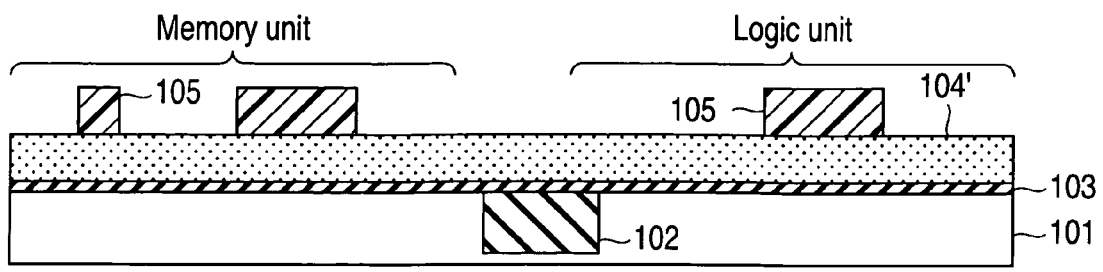

As shown in FIG. 4A, by forming a groove having a depth of approximately 300 nm in a top surface part of a Si substrate (semiconductor substrate) 101 and embedding an insulator film into the groove, an element isolation region 102 is formed. Then, an impurity material is introduced into the Si substrate 101 to form a well/channel, as in the case of the above-described reference example. Next, a gate insulating film 103 having a thickness of approximately 1-3 nm and a gate electrode film 104' having a thickness of approximately 100 nm are formed, and a resist pattern 105 having an electrode pattern is formed on the gate electrode film 104' by lithography.

Figure 4B:
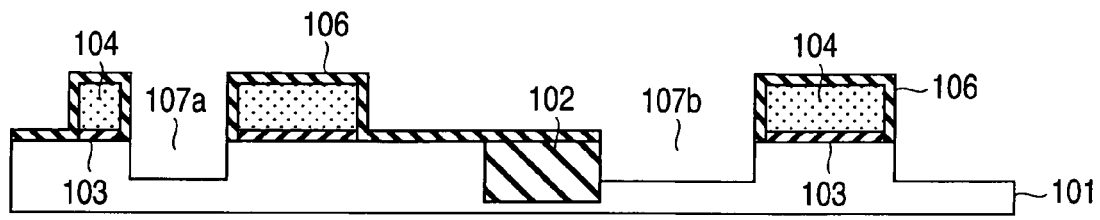

Then, after processing the gate electrode 104 by dry etching by using the resist pattern 105 as a mask, a cover film 106 having a thickness of approximately 20 nm and formed of SiN is formed on the entire surface of the substrate, as shown in FIG. 4B. Next, the cover film 106 formed on the top surface of the substrate is removed by thermal phosphoric acid from one side of the gate electrode of a transistor of the memory unit which is to form a shared contact and both sides of the gate electrode of a transistor which is to cause distortion in a channel of the logic unit. Following that, a groove 107 (107a, 107b) is formed by dry-etching a top surface part of the substrate using the cover film 106 as a mask. The reference number 107a denotes a groove for a shared contact in a first transistor of the memory unit, and the reference number 107b denotes a groove for realizing a distorted channel in a second transistor of the logic unit.

Figure 4C:
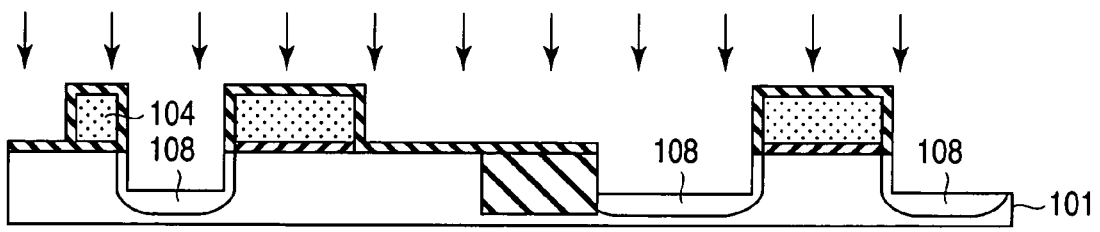

Then, as shown in FIG. 4C, a diffusion layer 108 is formed on a top surface of each of the grooves 107a, 107b by ion implantation.

Figure 4D:
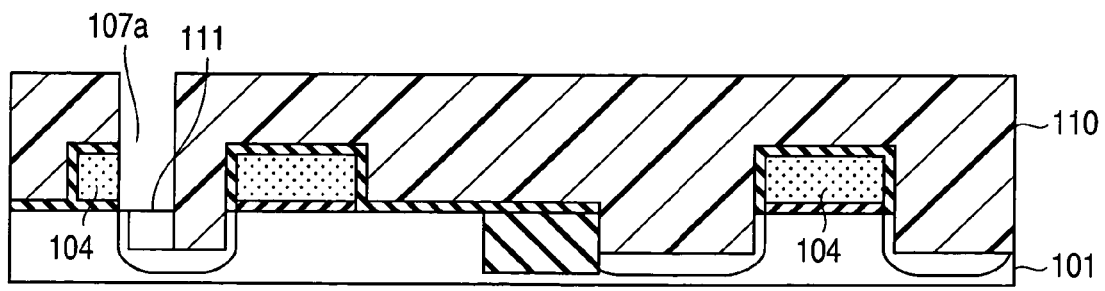

Next, the cover film 106 is removed by lithography and selective etching (such as CDE or VPC) from a part in which the gate electrode 104 and the source/drain region are connected. After that, a resist pattern 110 is formed, as shown in FIG. 4D, such that a side surface of the gate electrode 104 and approximately half of the groove 107a are exposed in the transistor of the memory unit. In this state, a silicon layer (first semiconductor layer) 111 is selectively grown in the groove 107a by means of a selective epitaxial growth technique.

Figure 4E:
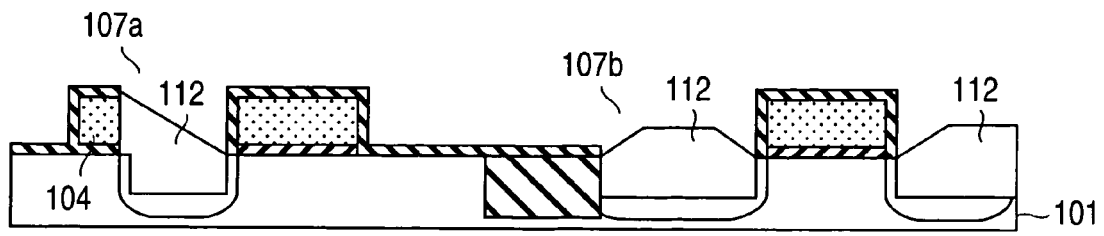

Then, after removal of the resist pattern 110, epitaxial growth of the silicon layer (second semiconductor layer) 112 is performed, as shown in FIG. 4E. More specifically, the silicon layer 112 (e.g., an SiGe layer) containing an impurity material such as germanium, carbon, boron, or phosphorous, is epitaxially grown by means of the selective epitaxial growth technique. Since only an exposed part of the substrate Si is epitaxially grown, the groove 107b is filled with the silicon layer 112. At the same time, since the epitaxial growth reaches the top surface of the substrate in the contact part (groove 107a), the sidewall surface of the gate electrode 104 and the substrate are electrically connected via the epitaxially grown silicon layer 112. The silicon layer 112 filled in the groove 107b of the logic unit causes distortion in the Si channel, which improves element characteristics such as mobility.

As shown in FIG. 4F, after removing the cover film 106, an extension region 113 is formed on the top surface of the substrate surface and a top surface of the epitaxial layer 112 by ion implantation using the gate electrode 104 as a mask.

Next, as shown in FIG. 4G, a sidewall insulating films 114 is formed on a side surface of the gate electrode 104. More specifically, the insulating film 114 is maintained only on the side surface of the gate electrode 104 after an insulating film formed of SiN, for example, is deposited on the overall surface and then etched back.

Next, as shown in FIG. 4H, a source/drain region 115 is formed on the top surface of the substrate and the top surface of the epitaxial layer 112 by ion implantation using the gate electrode 104 and the sidewall insulating film 114 as masks.

Then, as shown in FIG. 4I, metals such as Ti, Co, and Ni are deposited to form an alloy layer (salicide) 116, in order to reduce resistance of the gate electrode 104 and the semiconductor substrate surface. After that, an SiN film 117 which will be an etching stopper when a contact is formed and an oxide layer 118 which will be an interlayer insulating film are deposited and planarized by the CMP method.

Thereby, as shown in FIGS. 2 and 3, the source/drain region of the transistor P1 is connected to the gate electrode of the transistor P2.

The device structure will be completed by forming a contact hole and a metal wiring as in the case of the prior art.

Thus, according to the present embodiment, by connecting the source/drain region 115 to the gate electrode 104 via the epitaxially grown silicon layers 111, 112, low-resistance connection can be realized without expanding the area for the shared contact. Further, since the gate electrode 104 does not need to be arranged on the element isolation region to form a contact, increases in resistance and required contact area are not incurred. That is, junction leakage caused by contact of a shared contact with an extension region can be suppressed, and a contact can be formed without incurring increases in area or resistance. Thereby, improvement in element characteristics and miniaturization can be achieved.

Further, the groove formation and the selective epitaxial growth of silicon (and SiGe) in the shared contact can be performed simultaneously with groove formation and selective epitaxial growth for improving the performance of the transistor of the logic unit. Therefore, the number of steps necessary for forming the shared contact can be minimized. Indeed, only the step shown in FIG. 4D is required for forming the shared contact. That is, the steps for improving performance of the transistor of the logic unit can be effectively used for the shared contact, thereby minimizing the number of the steps.

Second Embodiment

FIGS. 5A-5C are cross-sectional views showing the manufacturing steps of a semiconductor device according to a second embodiment of the present invention. The structural elements same as those of FIGS. 4A-4I will be denoted by the same reference numbers, and detailed explanations of such elements will be omitted herein.

The present embodiment is different from the above-described first embodiment in that the groove 107 is not provided, and that an epitaxial layer is immediately formed on a surface of a substrate. The present embodiment is applied to a case where an elevated source/drain structure is adopted in a transistor of a logic unit.

In the first embodiment, the description was made with reference to a case where the groove 107 is provided on the semiconductor substrate 1 to connect the gate electrode 104 and the source/drain region. However, in order to connect the gate electrode 104 and the source/drain region, the source/drain region of the top surface part of the semiconductor substrate and the sidewall part of the gate electrode may of course be connected by means of the selective epitaxial growth technique instead of groove processing.

More specifically, after the step shown in FIG. 4A, a cover film 106 is formed on the entire surface of the substrate after processing the gate electrodes 104, as shown in FIG. 5A. Then, in a memory unit, the cover film 106 is removed from at least one of the sidewall surfaces of a gate electrode of a transistor which is to form a shared contact and the top surface of the substrate adjacent to the sidewall surfaces. At the same time, in a logic unit, the cover film 106 formed on the top surface of the substrate is removed from both sides of a gate electrode which is to form an elevated source/drain region.

Next, as shown in FIG. 5B, a silicon layer 112 formed of an impurity material such as germanium, carbon, boron and phosphorous, for example, an SiGe layer, is selectively grown by means of a selective epitaxial growth technique. Since the only the exposed part of the silicon substrate is epitaxially grown, an elevated source/drain structure is formed on side parts of the gate of the transistor of the logic unit. In a contact part of the memory unit, on the other hand, the epitaxial growth reaches the side surface of gate, and thereby the sidewall surface of the gate electrode 104 and the substrate are electrically connected.

The subsequent steps will be the same as those of the first embodiment. That is, the configuration shown in FIG. 5C can be obtained by forming an extension region 113, forming a sidewall insulating film 114, forming a source/drain region 115, an alloy layer (salicide) 116, and depositing and planarizing an oxide film 118 which will be an interlayer insulating film.

As explained above, according to the present embodiment, the epitaxially grown silicon layer 112 connects the source/drain region 115 with the gate electrode 104, and thereby the advantage obtainable from the first embodiment can be obtained.

Modified Example

The present invention is not limited to the above-described embodiments. In the embodiments, one side of the source/drain region is connected to the gate electrode in the transistor structure in the shared contact part, but both sides of the source/drain region may be connected to the gate electrode. Further, the semiconductor layer selectively grown in a part in which the semiconductor substrate and the gate insulating film are etched is not necessarily limited to an SiGe layer, but Si or SiC can be used instead. Moreover, the transistor is not limited to a MOS structure, but may of course be a MIS structure in which an insulating film other than an oxide film is used as a gate insulating film.

Further, the structure of the static RAM is not limited to that illustrated in FIGS. 1 and 2, and may be modified as appropriate. Moreover, the present invention is not limited to a shared contact part of a static RAM, but is applicable to various kinds of semiconductor devices having a shared contact for connecting a source/drain region of a MISFET and a gate electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
    forming a gate electrode via a gate insulating film in each of a memory unit and a logic unit on a semiconductor substrate;
    covering the gate electrodes and a top surface of the substrate with a cover film;
    removing the cover film formed on the top surface of the substrate from at least one side of the gate electrode of a first transistor of the memory unit which is to form a shared contact and from both sides of the gate electrode of a second transistor of the logic unit which is to cause distortion in a channel region;
    forming grooves in the substrate by etching a top surface part of the substrate using the cover film as a mask;
    removing the cover film formed on the gate electrode from at least one of sidewall surfaces of the gate electrode of the first transistor;
    filling each of the grooves provided in the substrate with a semiconductor layer by epitaxially growing the semiconductor layer in each of the grooves such that the epitaxial growth reaches said at least one sidewall surface of the gate electrode of the first transistor to electrically connect said at least one sidewall surface of the gate electrode of the first transistor and the substrate; and
    forming a source/drain region in one of the top surface part of the substrate and the semiconductor layer using the gate electrode as a mask.

2. The semiconductor device manufacturing method according to claim 1, wherein a sidewall insulating film is formed on a sidewall part of the gate electrode before the source/drain region is formed and after the semiconductor layer is formed.

3. The semiconductor device manufacturing method according to claim 1, wherein the substrate is formed of Si and the semiconductor layer is formed of one of SiGe, Si, and SiC.

4. The semiconductor device manufacturing method according to claim 1, wherein the epitaxial growth of the semiconductor layer comprises:
    filling the groove of the memory unit with a first semiconductor layer by selectively epitaxially growing the first semiconductor layer in the groove of the memory unit with the groove of the logic unit masked; and
    filling the groove of the logic unit with a second semiconductor layer by selectively epitaxially growing the second semiconductor layer after removing the mask to electrically connect the sidewall surface of the gate electrode of the first transistor and the first semiconductor layer via the second semiconductor layer.

5. The semiconductor device manufacturing method according to claim 4, wherein the substrate is formed of Si, the first semiconductor layer is formed of Si, and the second semiconductor layer is formed of SiGe.

6. A semiconductor device manufacturing method comprising:
    forming a gate electrode via a gate insulating film in each of a memory unit and a logic unit on a semiconductor substrate;
    covering the gate electrodes and a top surface of the substrate with a cover film;
    removing the cover film formed on the top surface of the substrate from at least one of sidewall surfaces of the gate electrode of a first transistor of the memory unit which is to form a shared contact and from a part of the top surface of the substrate adjacent to said at least one sidewall surface, and removing the cover film formed on the top surface of the substrate on both sides of the gate electrode of a second transistor of the logic unit which is to form an elevated source/drain structure;
    forming an elevated source/drain structure on both sides of the gate electrode of the second transistor, and connecting said at least one sidewall surface of the gate electrode of the first transistor and the substrate via a semiconductor layer, by epitaxially growing the semiconductor layer from the top surface of the substrate which has been exposed after removal of the cover film; and
    forming a source/drain region in one of a top surface part of the substrate and the semiconductor layer using the gate electrode as a mask.

7. The semiconductor device manufacturing method according to claim 6, wherein a sidewall insulating film is formed on a sidewall part of the gate electrode before the source/drain region is formed after the semiconductor layer is formed.

8. The semiconductor device manufacturing method according to claim 6, wherein the substrate is formed of Si and the semiconductor layer is formed of one of SiGe, Si, and SiC.

* * * * *